United States Patent
Grosz et al.

(10) Patent No.: US 11,917,381 B2
(45) Date of Patent: Feb. 27, 2024

(54) DIRECTIONAL RIBBON MICROPHONE ASSEMBLY

(71) Applicant: Shure Acquisition Holdings, Inc., Niles, IL (US)

(72) Inventors: Steven R. Grosz, Kenosha, WI (US); Benjamin Jay Grigg, Chicago, IL (US)

(73) Assignee: Shure Acquisition Holdings, Inc., Niles, IL (US)

(*) Notice: Subject to any disclaimer, the term of this patent is extended or adjusted under 35 U.S.C. 154(b) by 0 days.

(21) Appl. No.: 17/668,132

(22) Filed: Feb. 9, 2022

(65) Prior Publication Data

US 2022/0272452 A1  Aug. 25, 2022

Related U.S. Application Data

(60) Provisional application No. 63/149,543, filed on Feb. 15, 2021.

(51) Int. Cl.

| | | |
|---|---|---|
| *H04R 3/04* | (2006.01) | |
| *H04R 9/08* | (2006.01) | |
| *H04R 9/02* | (2006.01) | |
| *G06F 3/16* | (2006.01) | |
| *H04R 1/32* | (2006.01) | |
| *H04R 9/04* | (2006.01) | |
| *H04R 7/04* | (2006.01) | |
| *H03F 3/183* | (2006.01) | |
| *H04R 1/04* | (2006.01) | |

(52) U.S. Cl.
CPC .............. *H04R 3/04* (2013.01); *G06F 3/165* (2013.01); *H03F 3/183* (2013.01); *H04R 1/04* (2013.01); *H04R 1/326* (2013.01); *H04R 7/04* (2013.01); *H04R 9/025* (2013.01); *H04R 9/048* (2013.01); *H04R 9/08* (2013.01); *H03F 2200/03* (2013.01); *H04R 2420/09* (2013.01)

(58) Field of Classification Search
None
See application file for complete search history.

(56) References Cited

U.S. PATENT DOCUMENTS

| 5,715,319 A | 2/1998 | Chu |
|---|---|---|
| 7,502,481 B2 | 3/2009 | Abrams et al. |
| (Continued) | | |

FOREIGN PATENT DOCUMENTS

| CN | 206061073 U | 3/2017 |
|---|---|---|
| JP | 5103216 B2 | 12/2012 |
| JP | 2015111812 A | 6/2015 |

OTHER PUBLICATIONS

MXL UR-1 USB Ribbon Microphone visited at http://www.mxlmics.com/microphones/usb/UR-1/#:~:text=The%20MXL%20UR%2D1%20is%20the%20world's%20first%20USB%20ribbon,noise%20and%20optimized%20pure%20sound <https://protect-us.mimecast.com/s/IQppC5yA8MC0zkz4uxk2VI>.

(Continued)

*Primary Examiner* — Kenny H Truong
(74) *Attorney, Agent, or Firm* — Hugh Anslum Warren, V

(57) ABSTRACT

A ribbon microphone assembly may include a ribbon capsule assembly, an amplifier connected to the capsule assembly, an analog-to-digital converter connected to the amplifier, a digital signal processor connected to the analog-to-digital converter to compensate for an on-axis frequency response caused by a directional polar response of the ribbon microphone assembly, and a USB output port.

20 Claims, 14 Drawing Sheets

(56) References Cited

U.S. PATENT DOCUMENTS

| | | |
|---|---|---|
| 8,666,090 B1 | 3/2014 | Townsend |
| 2002/0131580 A1 | 9/2002 | Smith |
| 2003/0169891 A1 | 9/2003 | Ryan et al. |
| 2011/0064235 A1 | 3/2011 | Allston |
| 2012/0300959 A1 | 11/2012 | Marshall et al. |
| 2015/0217207 A1 | 8/2015 | Mickus et al. |
| 2016/0330546 A1* | 11/2016 | Barrentine ....... G10K 11/17857 |
| 2018/0310096 A1 | 10/2018 | Shumard et al. |
| 2020/0154201 A1 | 5/2020 | Townsend et al. |

OTHER PUBLICATIONS

Top 11 Best Active Ribbon Microphones on the Market in 2021 visited at https://mynewmicrophone.com/top-11-best-active-ribbon-microphones-on-the-market/ <https://protect-us.mimecast.com/s/lw1QC2KGRXik454Of12mSF/>.

Sandhill Audio 6011A Ribbon Microphones (Stereo Pair) visited at https://www.frontendaudio.com/sandhill-audio-6011a-ribbon-microphones-pair/ <https://protect-us.mimecast.com/s/IB8mC31YI3umPDP0t2OEwe/>.

AEA KU5A—Active Supercardioid Ribbon Mic visited at https://www.aearibbonmics.com/products/ku5a/.

Milab Microphones, Why the off-axis response is important visited at https://www.milabmic.com/.

* cited by examiner

DIRECTIONAL RIBBON MICROPHONE ASSEMBLY

CROSS-REFERENCE TO RELATED APPLICATION

This application claims priority to U.S. Provisional Patent Application No. 63/149,543, filed on Feb. 15, 2021, which is hereby incorporated by reference in its entirety.

FIELD

One aspect of the present disclosure relates to a directional ribbon microphone assembly with a universal serial bus (USB) output and employing a computing device to compensate for on-axis frequency response deficiencies.

BACKGROUND

Microphones convert sound into an electrical signal through the use of a transducer that includes a diaphragm to convert sound into mechanical motion, which in turn is converted to an electrical signal. Generally, microphones can be categorized by their transducer method (e.g., condenser, dynamic, ribbon, carbon, laser, or microelectromechanical systems (MEMS)). Of these transducer types, the ribbon type is sought after by musicians and recording engineers due to its characteristic sound.

Ribbon microphone capsules are configured with a transducer element that is a thin strip of corrugated metal or nanofilm suspended loosely between two permanent magnets connected to a transformer. The working principle of a ribbon microphone is that as the ribbon element responds to variations in the velocity of air particles, an AC voltage proportional to the velocity of the ribbon is produced and captured by contacts at the ends of the ribbon. This voltage is amplified by a step-up transformer and the audio signal appears at the output.

Ribbon microphones typically exhibit a bidirectional polar response that resembles a figure-eight pattern. Depending on the application and sound environment, ribbon microphones may also be configured to exhibit a cardioid, hypercardioid, or variable polar response. For example, a certain polar response may be desired for recording voice, whereas a different polar response may be desired for recording an instrument such as a guitar. Tuning a ribbon microphone to exhibit a desired directional polar response typically requires compromises to balance between polar response and on-axis frequency response. Often, tuning a ribbon microphone for a desired directional polar response results in deficiencies in on-axis frequency response and loss of the signature ribbon microphone sound characteristics.

Additionally, ribbon mics are not adapted for use with universal serial bus (USB) inputs commonly used in podcasting, teleconferencing, home-studio recording, streaming/recording through an iOS device, or any other application where high quality audio with USB and external line return (XLR) outputs are desirable.

SUMMARY

The following presents a simplified summary of the disclosure in order to provide a basic understanding of some aspects of the disclosure. This summary is not an extensive overview of the disclosure. It is not intended to identify key or critical elements of the invention or to delineate the scope of the invention. The following summary merely presents some concepts of the disclosure in a simplified form as a prelude to the more detailed description provided below.

The present disclosure solves many of the aforementioned problems by a ribbon microphone assembly comprising a computing device and employing a USB connector. Utilizing DSP obviates compromises between polar response and on-axis frequency response. Any resulting deficiencies in on-axis frequency response resulting from tuning the microphone for a desired directional polar response can be compensated for with equalization via DSP. Ultimately, this provides enhanced utility of ribbon microphones across a wide spectrum of applications and in diverse sound environments while preserving the classic ribbon sound. Additionally, employing a USB output makes the sonic qualities of a ribbon microphone available for podcasting, teleconferencing, and iOS recording applications without the need for additional equipment, which can add significant expense.

According to further aspects, the microphone may comprise multiple types of signal connectors, such as one or more universal serial bus (USB) connectors and/or one or more XLR connectors, which may be usable with a variety of other devices (e.g., Apple Mac computers and portable devices, Windows PC computers and portable devices, Android devices, XLR mixers and interfaces, etc.). The microphone connectors may comprise one or more digital signal connectors (e.g., USB) and/or one or more analog signal connectors (e.g., XLR).

According to further aspects, the circuitry providing output of audio via a USB connector may comprise a pre-amp and/or a digital signal processor (DSP) in the signal chain. The pre-amp and/or the DSP may be low-noise circuits.

According to further aspects, the DSP modes may be selected via a user interface on a device connected to the microphone, such as via a USB connector. The device may comprise, for example, a computing device such as a smart phone, tablet computer, personal computer, or the like. The device may present a user interface to the user, via which the user may select desired operational characteristics of the microphone such as a desired DSP mode or any other desired microphone setting.

According to further aspects, the microphone may itself comprise a user interface, and the user interface may comprise a capacitive-touch interface, which may be a curved capacitive-touch interface. This user interface may allow the user to manually select one or more microphone settings as desired.

According to further aspects, the microphone may be connected to a holder, such as a yoke that can be mounted in a desk mode and/or hanging studio mode. The holder may be, for example, U-shaped.

These as well as other novel advantages, details, examples, features and objects of the present disclosure will be apparent to those skilled in the art from following the detailed description, the attached claims and accompanying drawings, listed herein, which are useful in explaining the concepts discussed herein.

BRIEF DESCRIPTION OF THE DRAWINGS

Some features are shown by way of example, and not by limitation, in the accompanying drawings. In the drawings, like numerals reference similar elements.

DETAILED DESCRIPTION

In the following description of the various examples, reference is made to the accompanying drawings, which form a part hereof, and in which is shown by way of illustration various examples in which aspects may be practiced. References to "a" embodiment, "an" example, "an" and the like indicate that the embodiment(s) or example (s) of the invention so described may include particular features, structures, or characteristics, but not every embodiment or example necessarily includes the particular features, structures, or characteristics. Further, it is contemplated that certain embodiments or examples may have some, all, or none of the features described for other examples. And it is to be understood that other embodiments and examples may be utilized and structural and functional modifications may be made without departing from the scope of the present disclosure.

Unless otherwise specified, the use of the serial adjectives, such as, "first," "second," "third," and the like that are used to describe components, are used only to indicate different components, which can be similar components. But the use of such serial adjectives is not intended to imply that the components must be provided in given order, either temporally, spatially, in ranking, or in any other way.

Also, while the terms "front," "back," "side," and the like may be used in this specification to describe various example features and elements, these terms are used herein as a matter of convenience, for example, based on the example orientations shown in the figures and/or the orientations in typical use. Nothing in this specification should be construed as requiring a specific three dimensional or spatial orientation of structures in order to fall within the scope of the claims.

Figure 1A:
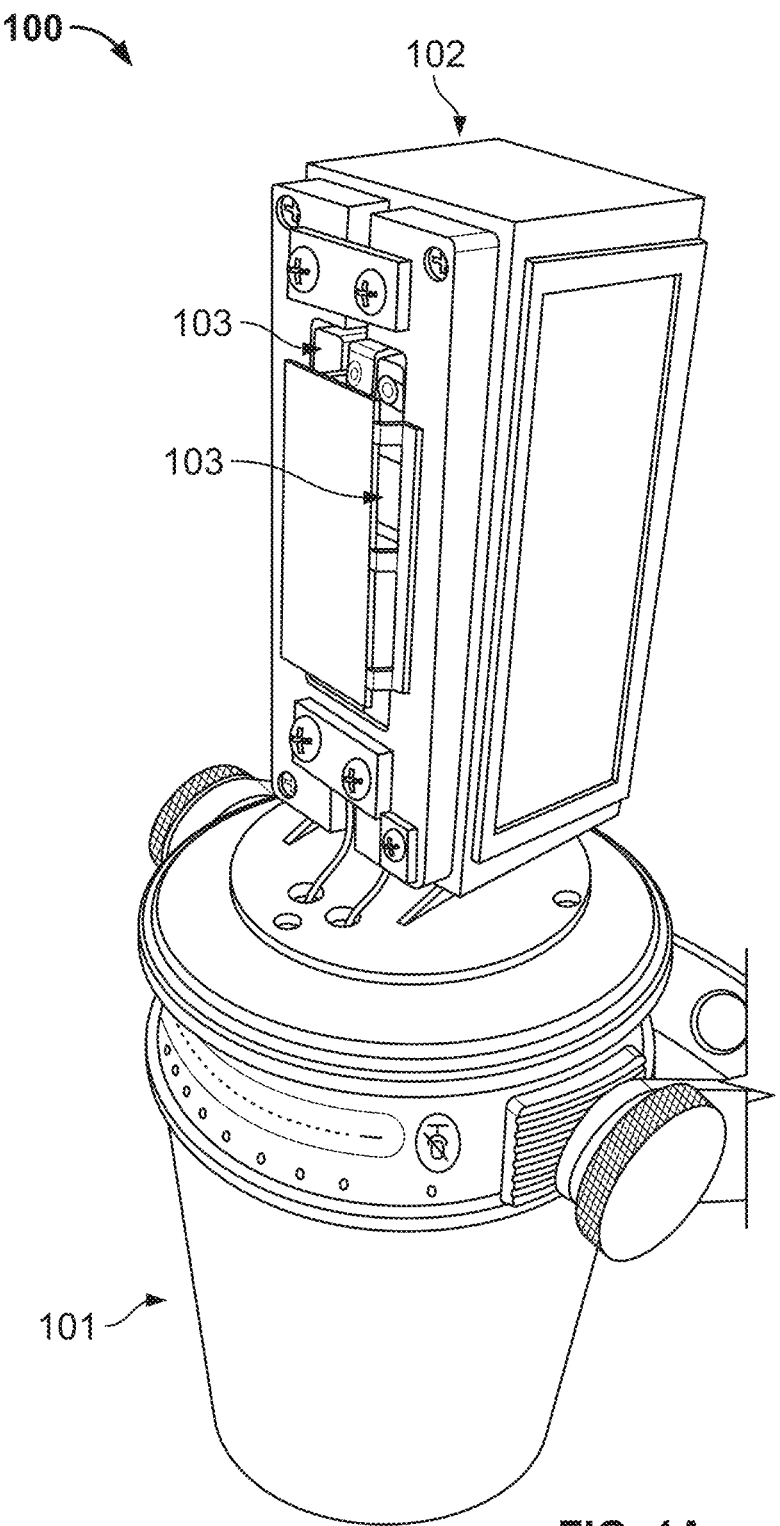
FIG. 1A is a perspective view of a first example of a microphone assembly made in accordance with the present disclosure.
Figure 1B:
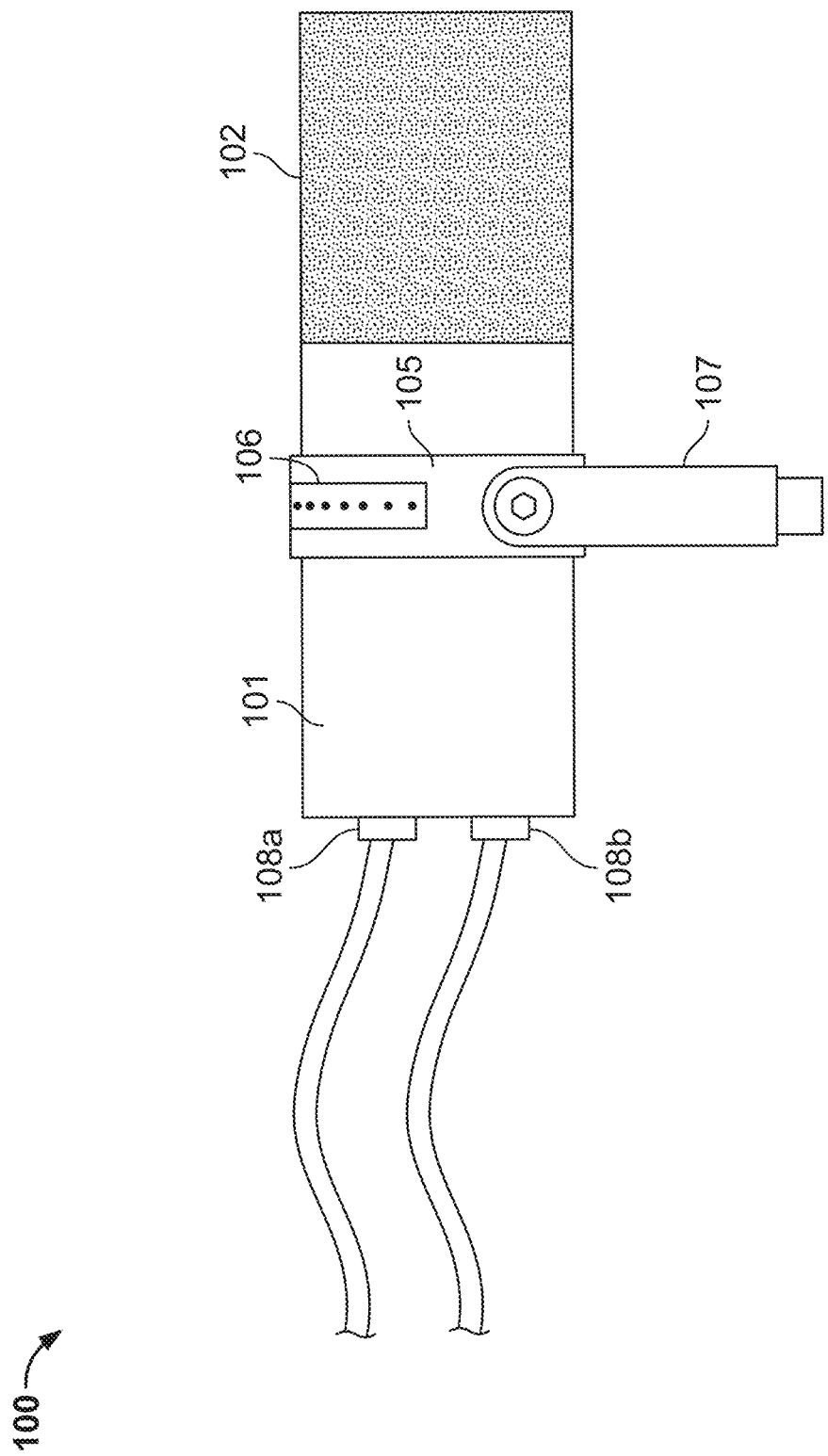
FIG. 1B shows a side view of an example microphone in accordance with aspects described herein.

FIGS. 1A and 1B illustrate examples of a ribbon microphone assembly 100. The microphone 100 may include a body 101, which may house one or more other components of the microphone, such as any of the electronic circuitry described herein. The ribbon microphone assembly 100 generally includes a capsule assembly 102 which further includes two magnets 103 disposed on both sides of a suspended directional ribbon diaphragm 104 (not shown). The assembly 102 may comprise a ring portion 105 or other portion, on and/or within which a user interface 106 may be disposed.

The user interface 106 may comprise, for example, a capacitive-touch interface that the user may control via touch (e.g., by tapping and/or sliding the user's finger). The user interface 106 may have a shape that conforms to the outer shape of the portion of the body 101 on/within which the user interface 106 is disposed. For example, where the portion of the body 101 is curved, the user interface 106 may also be curved in the same way as the portion of the body 101. The user interface 106 may be configured to allow selective application of various filters, including but not limited to a low frequency roll-off, low frequency boost, mid-frequency cut, mid-frequency boost, high-frequency roll-off, and high-frequency boost.

The body 101 may be connected to (e.g., mounted on) a holder 107, such as a yoke. The holder may be used to mount the microphone to some other object, such as to a desk or a wall.

The body 101 may have one or more connectors (i.e., output ports or input/output ports), such as connectors 108a and 108b. The connectors (generically referred to herein as one or more connectors 108) may include, for example, one or more universal serial bus (USB) connectors, one or more XLR connectors, one or more power connectors, and/or any other type of data and/or power connectors suitable for transporting signals such as power, digital data (including digital audio signals), and/or analog audio signals to and from the circuitry of the microphone 100. In one particular example, connector 108a may be an XLR connector and connector 108b may be a USB connector. Connector 108b may be configured to accept various types of USB hardware, including USB Type-A, USB Type-A mini, USB Type-A micro, USB Type-B, USB Type-B Mini, USB Type-B Micro, and USB Type-C plugs.

Figure 2:
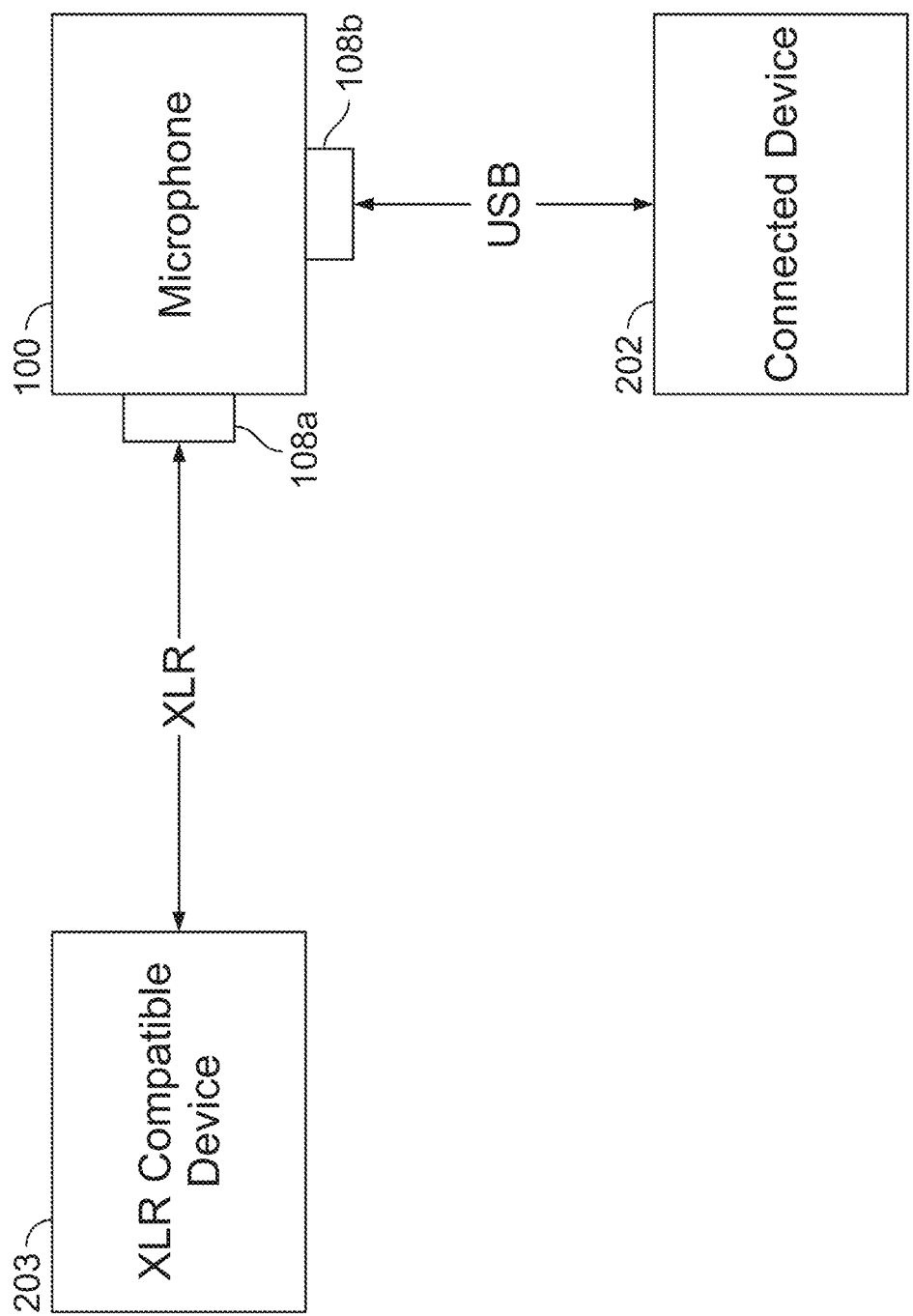
FIG. 2 shows a block diagram showing an example interconnection of a microphone, such as the microphone of FIGS. 1A and 1B, with one or more devices, in accordance with aspects described herein.

FIG. 2 shows a block diagram showing an example interconnection of a microphone, such as the microphone 100, with one or more other devices, in accordance with aspects described herein. The microphone 100 may be connected, via a USB cable (such as the connector 108b) to another device, in this example a connected device 202. The device 202 may be a computing device, such as a smart phone (e.g., an iPhone or Android phone), a tablet computer, a laptop computer, a desktop computer, a server, etc. As will be described later, the microphone 100 may comprise a digital signal processing system (DSP), and the device 202 may be used to control one or more settings of the microphone 100, including which mode the DSP is operating in, via signals transmitted on the USB cable connected between the device 202 and the microphone 100. In addition to transmitting DSP mode information, the USB cable may also be used by the microphone 100 to transmit digital signals representative of audio.

The microphone 100 may also be connected to one or more other devices, such as another XLR compatible device 203, via another connector such as another XLR connector. Examples of other XLR compatible devices may include yet another microphone, a mixer, an amplifier, a computing device, etc.

Figure 3:
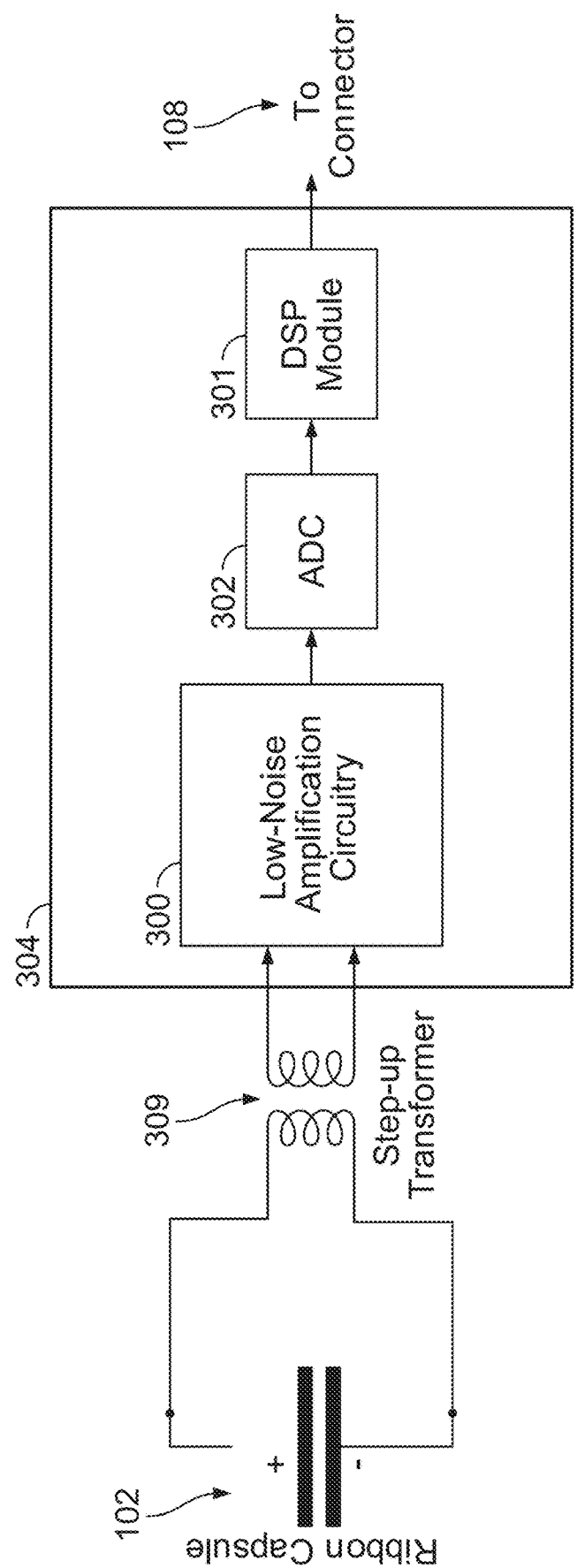
FIG. 3 is a schematic example of the circuitry of the ribbon microphone assembly.

Referring to FIG. 3, a step-up transformer 309 is electrically connected to receive sound from the directional ribbon capsule 102 and to send the converted sound signal to the low-noise amplification circuitry 300. The step-up transformer 309 may be configured with a 33:1 turns ratio. Yet different configurations may also be employed to help enable maximization of the signal voltage level while minimizing output impedance. A printed circuit board (PCB) 304 may comprise the low-noise amplification circuitry 300, a DSP module 301, and an ADC 302. DSP module 301 may be implemented on a MOS integrated circuit (IC) chip, an application specific integrated circuit (ASIC), a complex programmable logic device (CPLD) or a field-programmable gate array (FPGA) chip. The ASIC could contain a transistor, such as a FET. The low-noise amplification circuitry 300, DSP module 301, and ADC 302 can be connected electronically, such as by wire, or can be incorporated into a single MOS integrated circuit (IC) chip, an application specific integrated circuit (ASIC), a complex programmable logic device (CPLD) or a field-programmable gate array (FPGA) chip.

The sound signal generated by capsule assembly 102 is routed to step-up transformer 309 and subsequently applied to the low-noise amplification circuitry 300. The low-noise amplification circuitry 300 may be configured in a variety of ways, such as a differential in-single out discrete low noise amplifier with variable gain stage.

The amplified signal is then output to ADC 302. The purpose of the ADC is to convert the analog output of the microphone, or microphone preamplifier, to a digital signal that can either be used as a direct digital output from the microphone to the connector 108, or a feed to a computing device such as an application specific integrated circuit (ASIC), a complex programmable logic device (CPLD), or a field-programmable gate array (FPGA) chip. In one example, the computing device may include digital signal processing (DSP) module 301. The purpose of the DSP module is to modify the output of the microphone after ADC 302.

The processed sound signal resulting from the DSP module 301 is electronically routed to connectors 108. As mentioned above, in one example, connector 108 may be configured as a USB output port. In another example, multiple connectors may be configured to receive the processed sound signal from ADC 302, one or more connectors being configured as a USB output port (with digital output) and one or more ports being configured as an XLR output port (with analog output). In an example where connector 108 is configured as a USB output port, the USB output port may feature a connector integral to the body 101 and configured for direct connection to a user device utilizing a standard USB input, including a general computer, an iOS or Android device, a tablet computer, a laptop computer, USB mixers and interfaces, etc.

Figure 4:
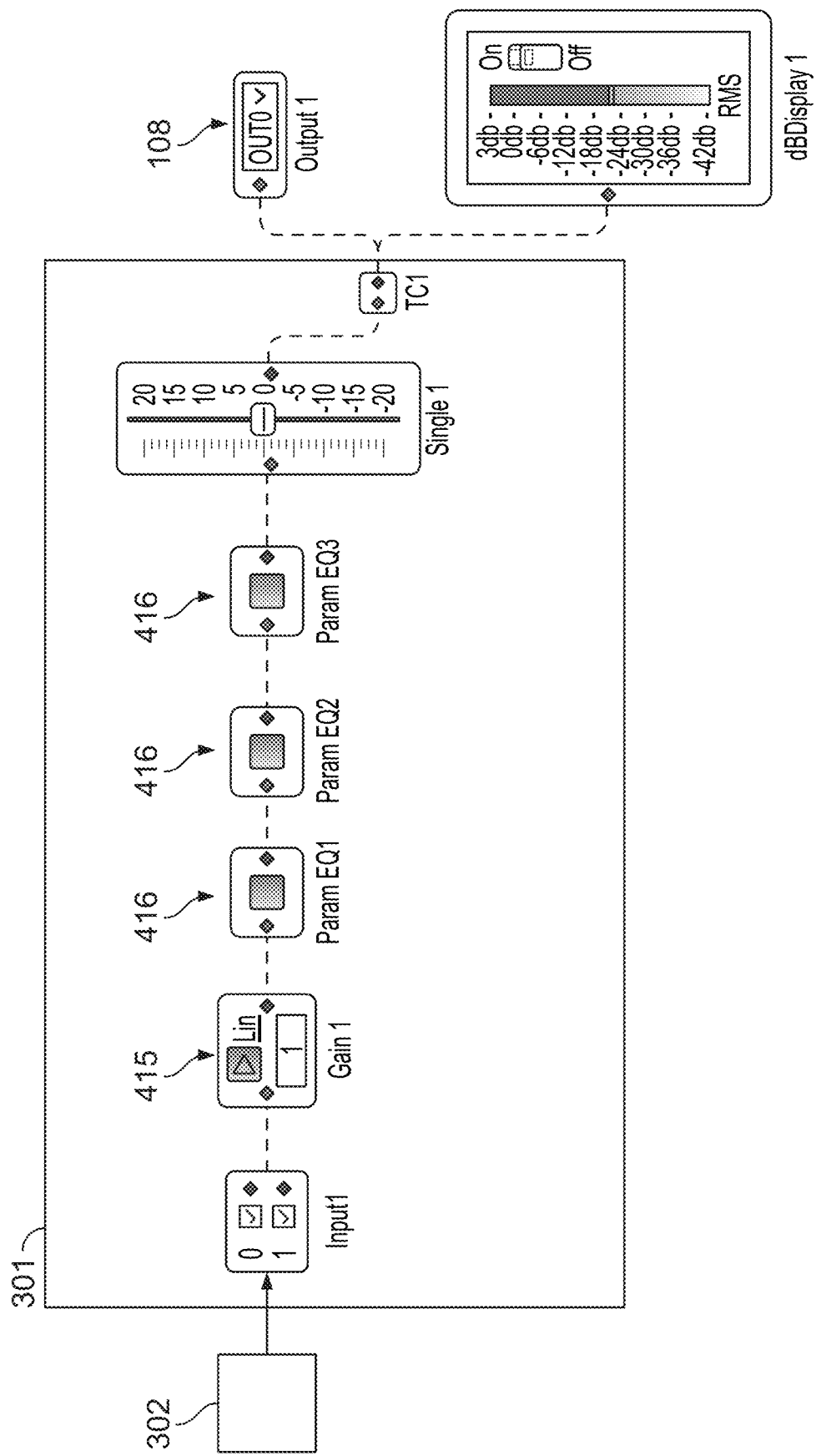
FIG. 4 depicts an example signal path configured in accordance with the present disclosure.

Configuring effective directional ribbon microphones typically requires compromises to balance between polar response and on-axis frequency response. Often, tuning a microphone for a desired directional polar response results in deficiencies in on-axis frequency response unique to the polar response. To address this problem, DSP module 301 is configured to receive the digital sound signal from ADC 302 and compensate for a plurality of sonic deficiencies present in the on-axis frequency response cause by the directional polar tuning. In one example, DSP module may be configured so that at least one parametric EQ is applied to the digital sound signal received from ADC 302. FIG. 4 depicts an example signal path such that the digital signal from ADC 302 is routed to DSP module 301. Gain stage 415 is applied after the input of DSP module 301. The digital sound signal is then routed to a plurality of parametric equalizers 416 and then routed to connector 108. Gain stage 415 may also be applied after the plurality of parametric equalizers 416.

Tuning a ribbon microphone to exhibit a desired directional polar response for a particular application results in known on-axis frequency response deficiencies at one or more frequency bands. To compensate for these known deficiencies that result from a desired directional polar response, the DSP module 301 may be configured to selectively increase or decrease at least one predetermined frequency and/or frequency ranges of the sound signal, as the case may be. For example, adding acoustic resistances to make a ribbon microphone directional (such as cardioid or super-cardioid) can result in low frequency loss. Therefore, to compensate for this low frequency loss a parametric equalizer (EQ) may be configured to boost a discrete low frequency or a range of low frequencies. In some instances, it may also be desirable to attenuate (reduce or decrease the value of) a certain predetermined frequency, multiple predetermined frequencies, and/or a predetermined frequency range or multiple predetermined frequency ranges using a parametric EQ.

Figure 5A:
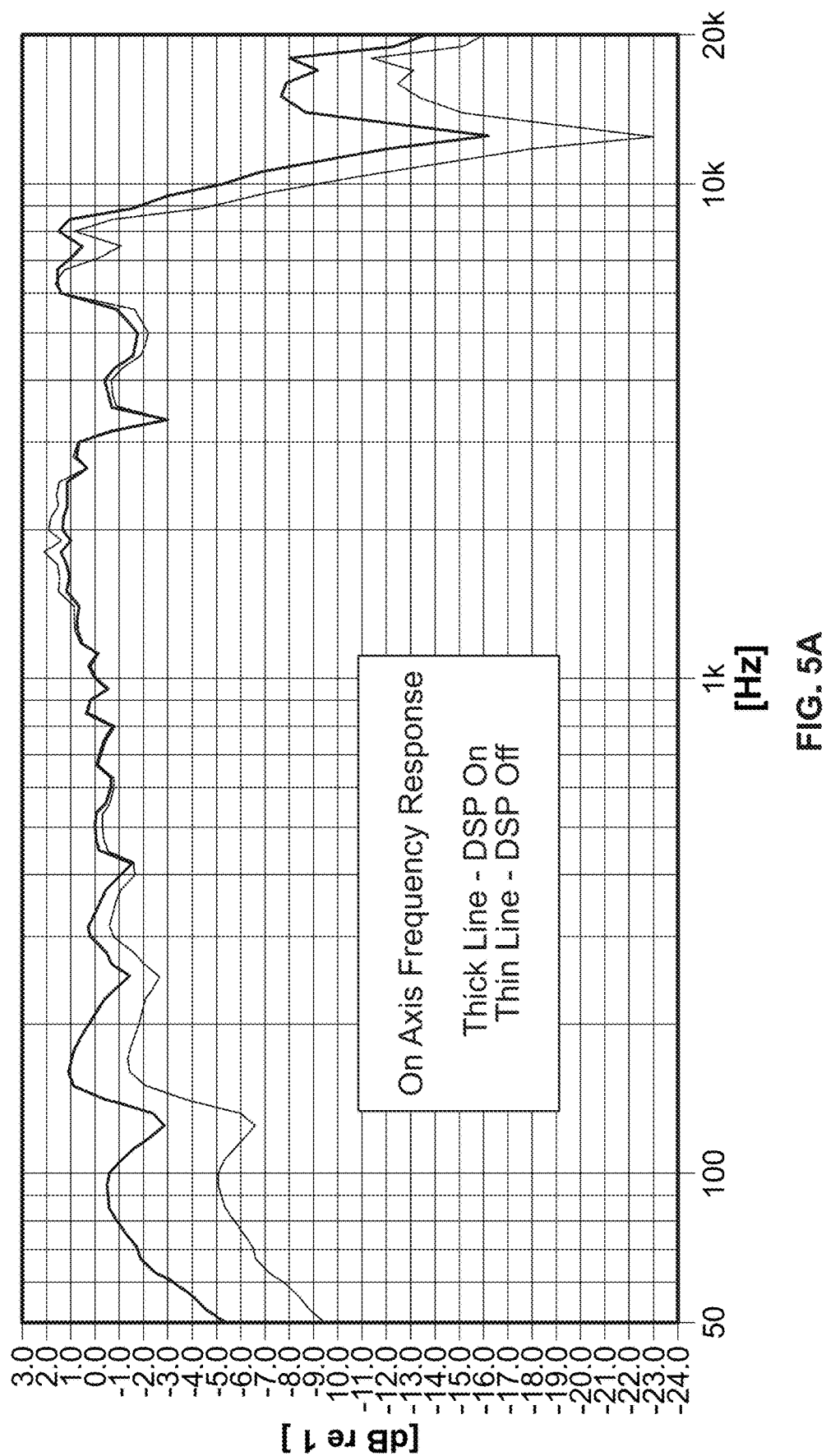
FIG. 5A is an on-axis frequency plot comparison of a super-cardioid ribbon microphone assembly with a DSP module active and inactive.
Figure 5B:
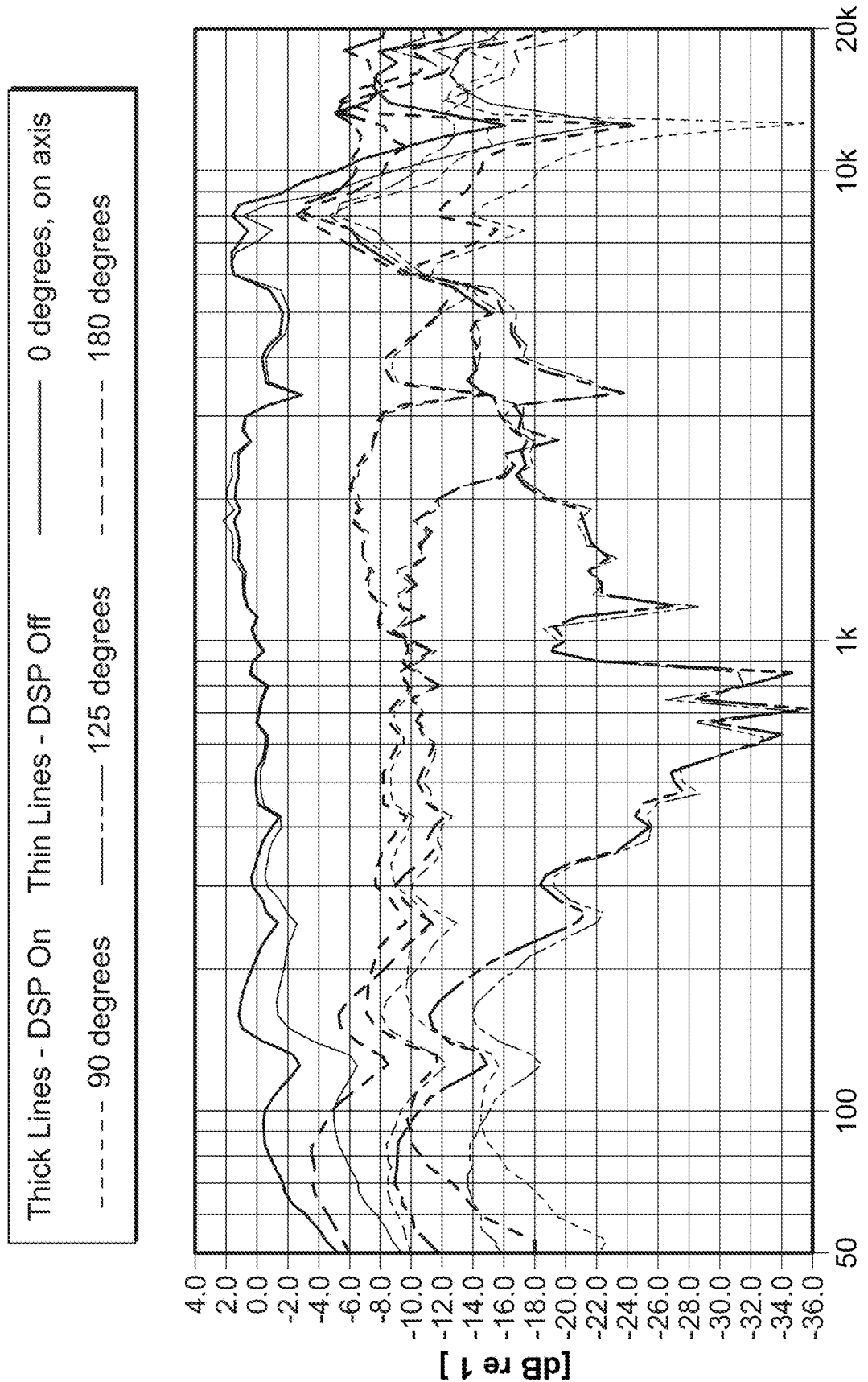
FIG. 5B is a complete on- and off-axis frequency response comparison of a super-cardioid ribbon microphone assembly with a DSP module active and inactive.

FIGS. 5A and 5B illustrate various frequency plots of a super-cardioid ribbon microphone assembly 101 with DSP module 301 both active and inactive. For example, FIG. 5A shows the on-axis frequency plot comparison of the ribbon microphone assembly 100 with DSP module 301 active and inactive. The thick line illustrates the on-axis frequency response with DSP module 301 applying 5 dB of equalization (EQ) at 75 Hz and 7 dB of EQ at 13 kHz. The thin line represents the on-axis frequency response of ribbon microphone assembly 101 with DSP module 301 inactive. FIG. 5B illustrates a complete on-axis and off-axis frequency response comparison of the super-cardioid ribbon microphone assembly 100 with DSP module 301 active (thick lines) and inactive (thin lines) at 0° (in front of the microphone) (solid line), 90° (dashed line), 125° (long-dashed-dotted line), and 180° (directly behind the microphone) (short-dashed-dotted line). As in FIG. 5A, 5 dB of EQ were applied at 75 Hz and 7 dB of EQ were applied at 13 kHz.

DSP 301 may be configured to operate in a plurality of general and application-specific DSP modes. General and/or application-specific modes may include dynamic range compression, frequency dependent signal compression, limiting, and other various compression modeling. DSP 301 may also be configured to operate as an application-specific EQ. For instance, it may be desirable for a user to select an equalization profile with pre-configured parameters based on the instrument type, for example, kick drums, guitar, or vocals, etc.

In one example, DSP module 301 may be configured to model any number of analog circuits. In some examples, the DSP module 301 may be implemented using a digital signal processor, one or more analog components, and/or a combination thereof. Yet in another example, each DSP application may be embodied as software executed by one or more processors such as a processor that is part of controller 604, as shown in FIG. 6B and explained in further detail below.

Figure 6A:
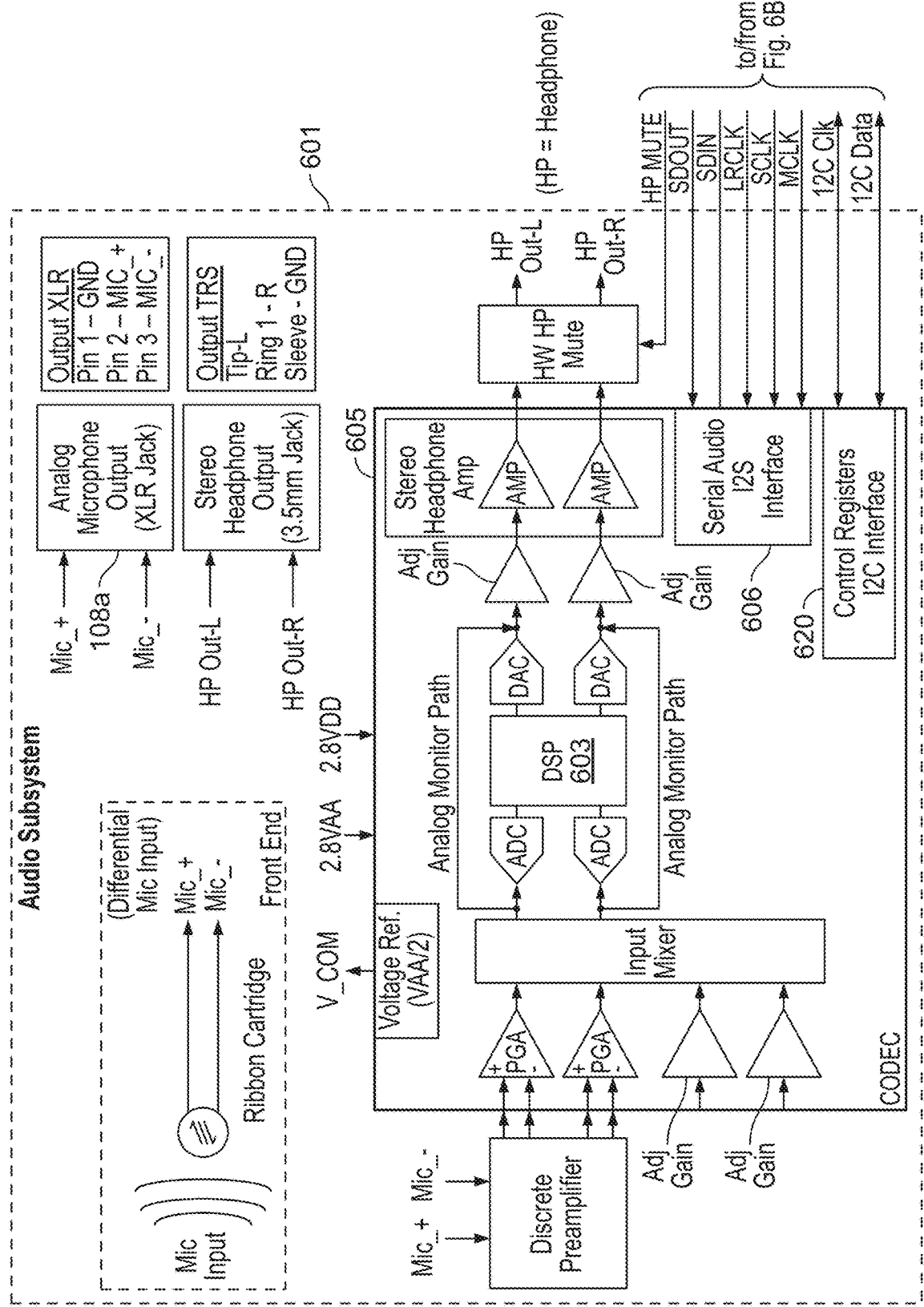
FIG. 6A shows an example block diagram of one or more portions of an example microphone (such as the microphone of FIGS. 1A and 1B) including at least a portion of a digital signal processing system (DSP), in accordance with aspects described herein.
Figure 6B:
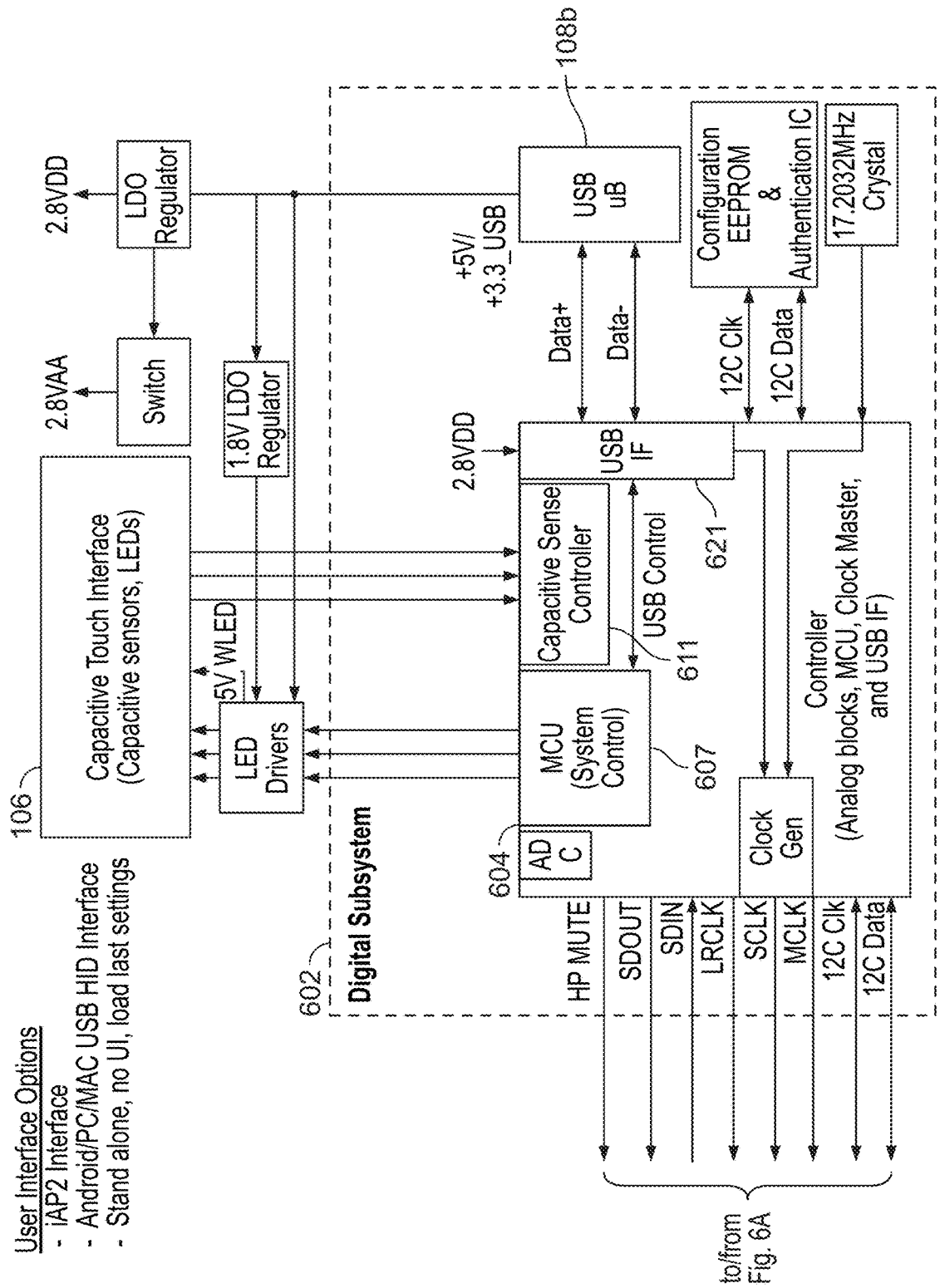
FIG. 6B shows another portion of the block diagram of FIG. 6A.

FIGS. 6A and 6B together show another example block diagram of one or more portions of an example microphone, such as the microphone 100. In the shown example, the microphone 100 may be considered to be logically divided into audio subsystem functionality (referred to herein as the "audio subsystem 601") and digital subsystem functionality (referred to herein as the "digital subsystem 602").

The audio subsystem 601 may be responsible for routing and processing audio and digital signals representing audio. The audio subsystem 601, which may physically share circuit components with the digital subsystem 602, may have a front end including the microphone capsule assembly 102, one or more XLR connectors, an audio jack (which may be stereo headphone jack), and a microphone preamplifier.

The audio subsystem may further include circuitry such as amplifiers (e.g., adjustable gain amplifiers, input mixers, analog-to-digital converters (ADCs), digital-to-analog converters (DACs), control registers 620, data interfaces such as an I2C interface, audio interfaces such as a serial I2S interface 606, and a DSP 603, interconnected as shown in FIGS. 6A and 6B. As indicated in FIG. 6A, an audio path exists from the microphone cartridge and/or the XLR connector (as analog audio signals), through the input mixer, digitized by the ADCs to generate digital audio signals, through the DSP, through a set of amplifiers, and then ultimately provided as DSP-processed PCM digital audio data to be transmitted by a CODEC 605 via the serial audio I2S interface 606 to a controller 604 (FIG. 6B), which may be implemented as, for example, a system-on-chip (SoC). Digital audio and/or other data may be transmitted bidirectionally (from the CODEC 605 to the controller 604, and/or from the controller 604 to the CODEC 605) via the I2S connection. Any of the circuitry in FIGS. 6A and 6B may be implemented, for example, as a programmable gate array (PGA). Example amplifier components embodied by one or more PGAs are labeled "PGA" in FIG. 6A. Some or all of the above-mentioned circuitry may be embodied as part of a CODEC 605, which may be an integrated circuit device.

The CODEC 605 may contain adjustable gain stages and/or mixers for the audio inputs. For example, the indicated PGA-embodied amplifier components for the microphone inputs may have adjustable gain ("Adj Gain"), such as an adjustable gain of approximately 36 dB. The line inputs may also have adjustable gain, such as an adjustable gain of approximately 6 dB. The ADCs may be able to simultaneously accept, for example, dual microphone inputs, a combination of a microphone input and a line input, or dual line inputs (e.g., two channels in each of these situations). The indicated PGA-embodied amplifier components may have non-inverting inputs with variable impedance, so that the microphone 100 may be cross-connected to both PGAs with each leg seeing the same input impedance.

The digital subsystem 602 may interconnect with the analog audio subsystem 601 via one or more signaling lines, such as those shown interconnecting the circuitry of FIG. 6A with the circuitry of FIG. 6B. The digital subsystem 602 may be responsible for overall control of the microphone 100, and may include components such as one or more processors. The controller 604 may also embody the one or more PGAs discussed above and shown in FIG. 6A.

The controller 604 may have various signal inputs and outputs for communicating with other parts of the digital subsystem 602 and the analog subsystem 601, such as those inputs and outputs shown in the figures. For example, the digital audio signals provided by the audio subsystem 601 may be received by the controller 604 for further routing and/or processing, and the resulting processed and/or routed digital signals may then be passed from the controller 604 to the USB connectors via a USB interface (labeled "USB IF" in the figures). Thus, the audio path in the audio subsystem 601 may further include the controller 604 and the USB connector 108b, ultimately carrying the resulting audio data via the paths labeled "Data+" and "Data-" between the controller 604 and the USB connector 108b. These "Data+" and "Data-" lines connected with the USB connector 108b may also bi-directionally carry control signaling to and from the microphone 100 in addition to the aforementioned audio data. Controller 604 may be configured to implement both iAP and standard USB audio endpoints. The on-board MCU 607 may be used for system control and may link to iAP controls.

The controller 604 may also contain one or more processors (such as an MCU 607) for performing various functionality. The controller 604 may also store, in a non-transitory computer-readable storage medium (such as memory, which may be part of or connected to MCU 607), executable code (e.g., software) for performing various steps. When executed by the controller 604, or at least by the one or more processors thereof, the code may cause the controller 604 to perform the steps defined by the code. The capacitive touch interface 106 may be controlled by the MCU 607. The MCU 607 may be assisted with controlling the capacitive sensors by way of a controller, such as a capacitive sense controller 611.

While a USB connection is discussed between the connector 108 and the user device, other types of wired or wireless connections may be used. For example, the connection between the connector 108 and the user device may instead be a wireless connection, such as a WiFi connection, a BLUETOOTH connection, a near-field connection (NFC), and/or an infrared connection. Where the connection is wireless, the connector 108 and the user device may include a wireless communications interface.

Figure 7:
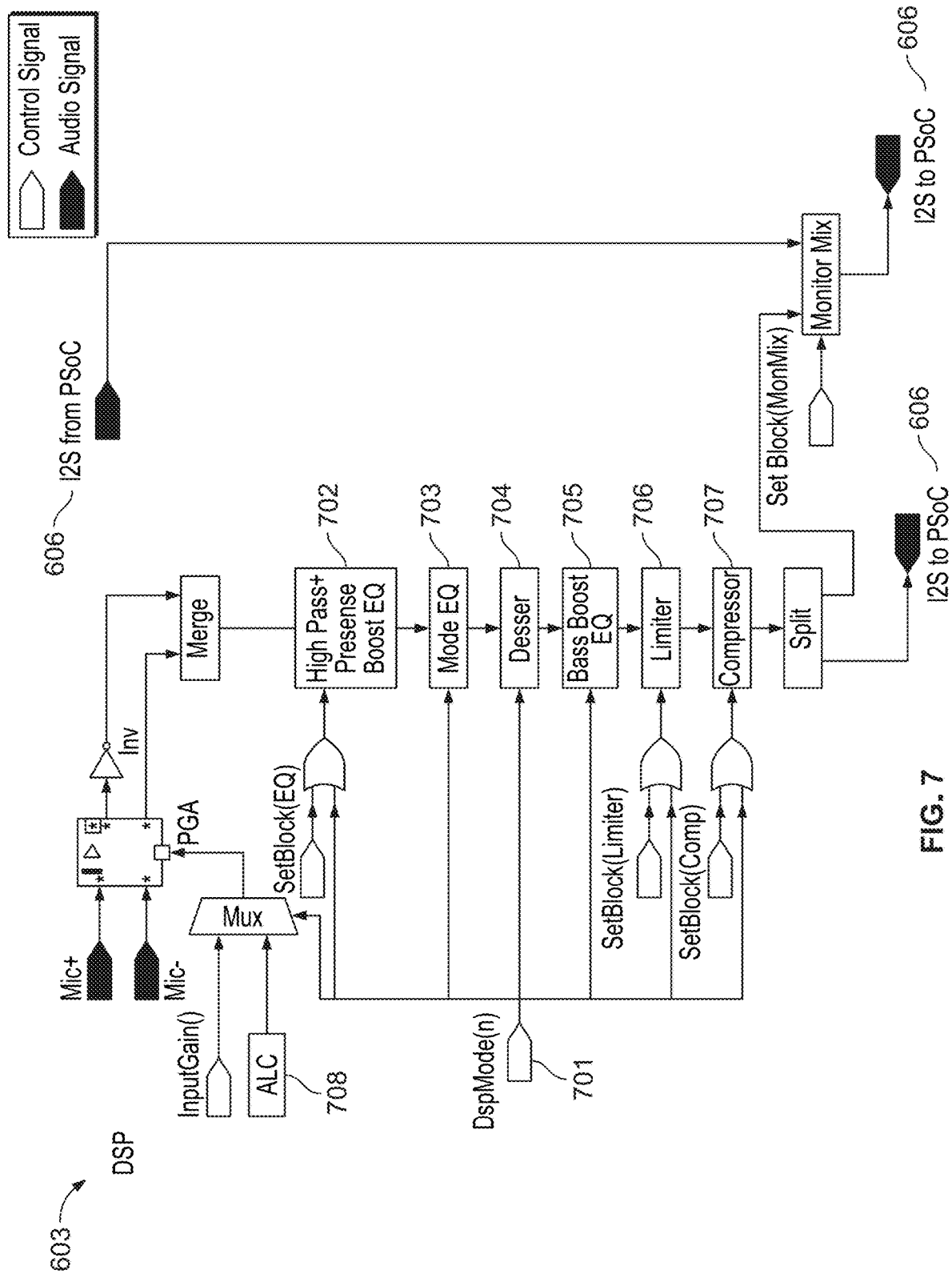
FIG. 7 shows another example block diagram of one or more portions of an example microphone (such as the microphone of FIGS. 1A and 1B), in accordance with aspects described herein.

FIG. 7 shows another example block diagram of one or more portions of an example microphone (such as the microphone 100), including details of at least a portion of the DSP 603. The DSP 603 may include, for example, one or more modules for processing audio, including for example one or more equalizers such as a high frequency boost equalizer 702 and/or a mode equalizer 703, a de-esser 704, a low-frequency boost equalizer 705, a limiter 706, a compressor 707, and/or an automatic level control (ALC) 708. Automatic Level Control (ALC) is a way of adjusting the gain of an amplifier based on the desired output signal level. By adjusting the input gain of the amplifier, the ALC module 708 provides a way to maintain a desirable (e.g., maximize) signal to noise ratio of the audio output. The Automatic Level Control setting may be set to, for example, particular values of the parameters attack, hold, decay, maximum gain, and/or target gain, each depending upon which of the plurality of DSP modes is selected. Each of the modules 702-708 may be embodied, for example, as physical dedicated circuitry and/or as software executed by one or more processors such as a processor that is part of controller 604. It is to be understood that DSP 301 may include none, some, or all of the features as those of DSP 603 listed herein. DSP 301 and DSP 603 may be used interchangeably herein to refer to the same structure.

Figure 9:
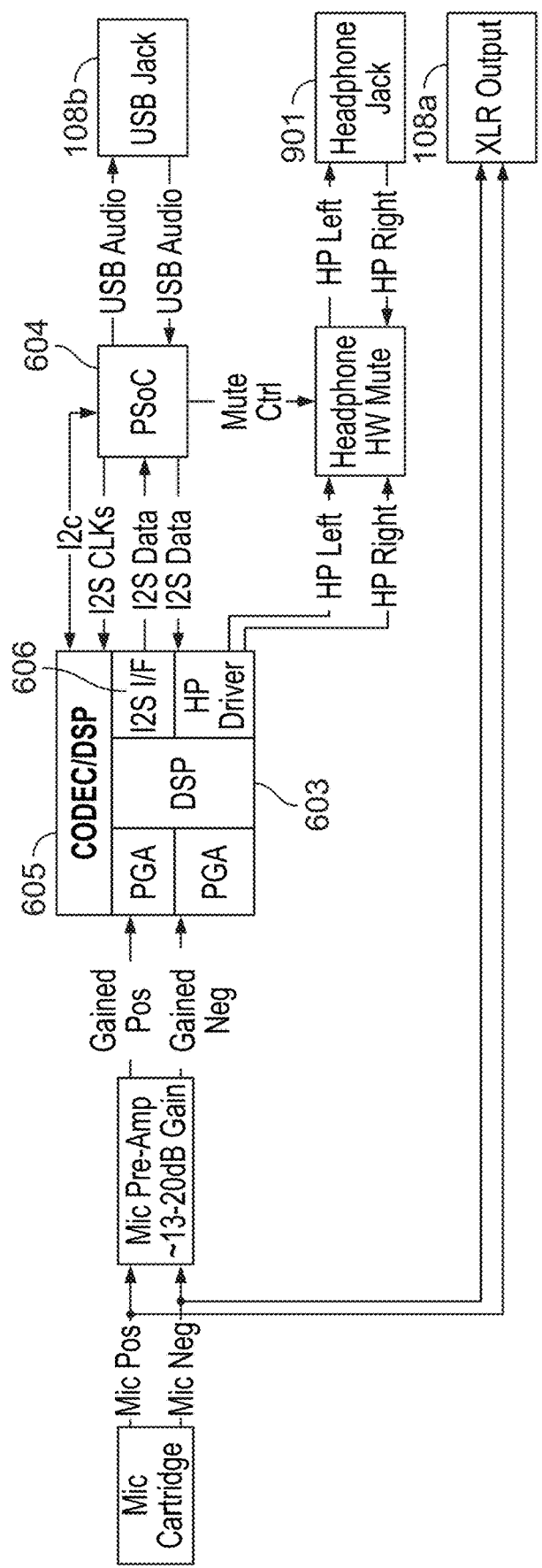
FIG. 9 shows another example block diagram of one or more portions of an example microphone (such as the microphone of FIGS. 1A and 1B), in accordance with aspects described herein.

FIG. 9 shows another example block diagram of one or more portions of an example microphone, such as the microphone 100. In this block diagram, an example audio output chain of the microphone 100 is shown, including both the analog output/input to/from the XLR connector 108a, analog output to a headphone (HP) jack 901, and the digital output to the USB connector 108b. FIG. 9 includes at least a portion of each of the audio subsystem 601 and the digital subsystem 602 shown from a different logical and functional point of view, specifically from the point of view of the audio subsystem 601.

Figure 10:
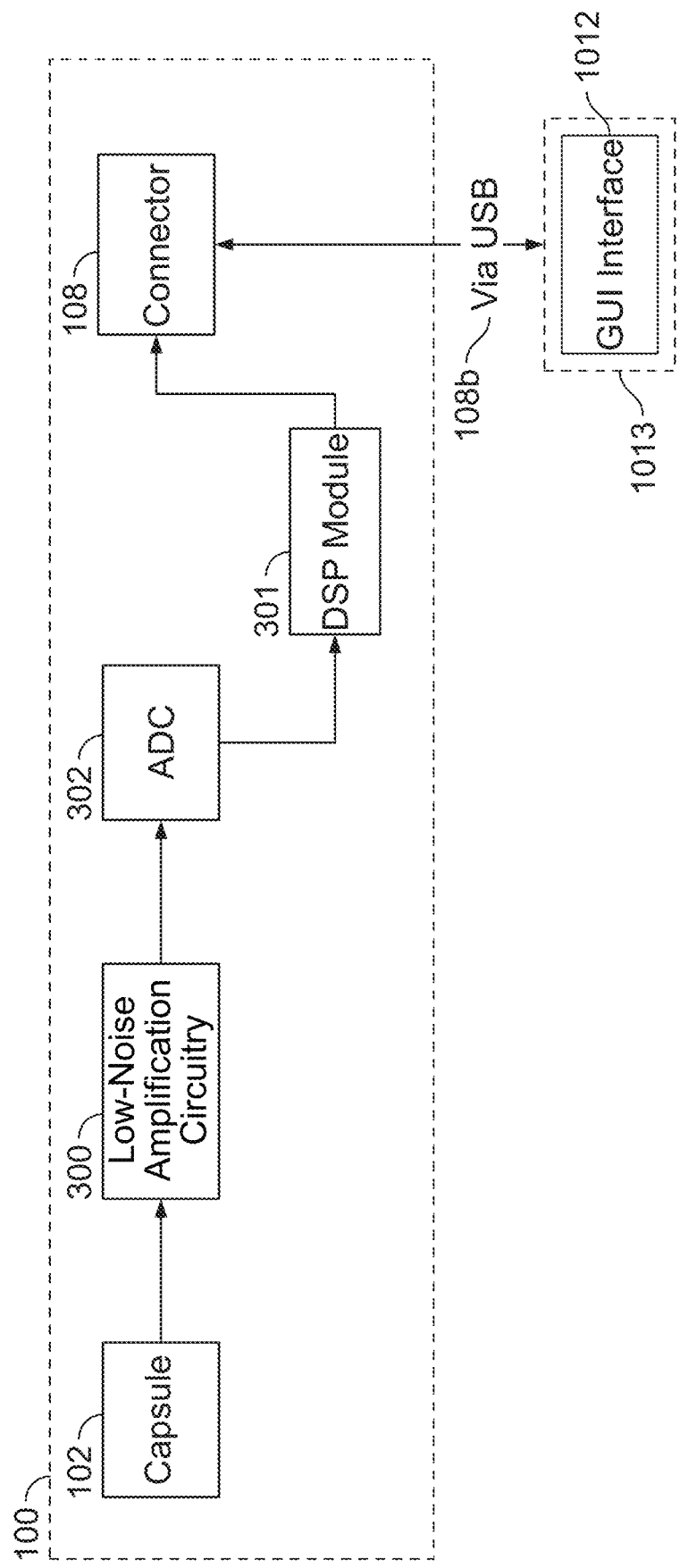
FIG. 10 is a block diagram of one example of a system for compensating for on-axis frequency response deficiencies.

It may be desirable for a user to virtually select additional post-processing filters to apply to the processed sound signal. Referring to FIG. 10, in one example, a system compensating for on-axis frequency response deficiencies includes a GUI 1012 that is displayable on a device 1013, which is in turn connected to the ribbon microphone assembly 100 via the USB connector 108b. The device 713 may be a computing device, such as computing device 800 (described further below), a smart phone (e.g., an iPhone or Android phone), a tablet computer, a laptop computer, a desktop computer, a server, etc. GUI 1012 is configured to manipulate digital signal processing module 301 based on user input. GUI 1012 may be configured with virtual selection controls to allow a user to selectively apply at least one frequency compensation filter to the processed sound signal. A variety of frequency compensation filters may be available, including low frequency roll-off, low frequency boost, mid-frequency cut, mid-frequency boost, high-frequency roll-off, and high-frequency boost filters. Moreover, GUI 1012 may be configured to allow a user to apply an adjustable parametric equalizer to the processed sound signal and specify: 1) one or more frequency bands; 2) particular filtering type (high-pass filter, low shelf filter, or peaking filter); and 3) particular values of boost/cut and/or Q parameters. GUI 1012 may also be configured to enable a user to apply extensive compression and limiter modeling to the processed sound signal. For example, compression settings such as ratio, frequency, range, hold time, release time, threshold, knee, etc. may be configurable by the user in GUI 1012.

Figure 11:
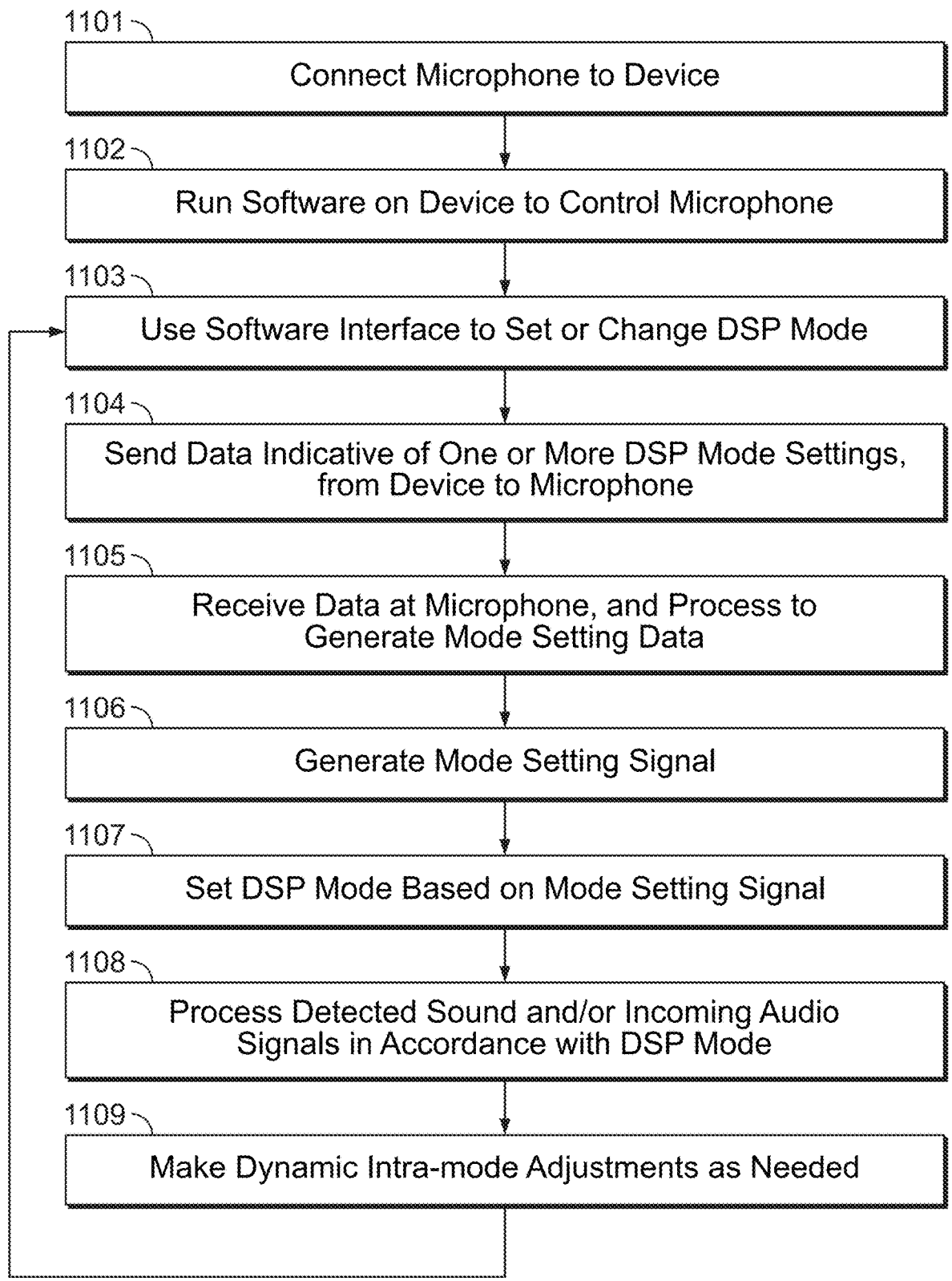
FIG. 11 shows an example flow chart of a method that may be performed in accordance with aspects described herein.

FIG. 11 shows an example flow chart of a method that may be performed. Some of the steps may be performed by a microphone (such as the ribbon microphone 100), others of the steps may be performed by a device connected to the microphone, and still others of the steps may be performed by a user of the device and/or of the microphone. While the method shows particular steps in a particular order, the method may be further subdivided into additional sub-steps, steps may be combined, and the steps may be performed in other orders without necessarily deviating from the concepts described herein.

In operation, a user may connect the microphone 100 to a user device, such as with a USB cable connected between a USB connector of the user device 202 and the USB connector 108b of the microphone 100 (FIG. 11, step 1101). The user may further run software (e.g., an app) on the device 202 that is configured to control one or more settings of the microphone 100 (step 1102). For example, the software, when executed, may cause the user device 202 to display a user interface that the user may interact with (e.g., via a touch screen, mouse, keyboard, etc.) to select a DSP mode that the microphone 100 should operate in (step 1103). In response to the user selection, the user device 202 may send, via the USB cable, a control signal (such as data) indicative of one or more DSP mode settings in accordance with the user selection (step 1104). This control signal may be received at the USB connector 108b of the microphone 100.

Next, the control signal at the USB connector 108b may be received by a USB interface (FIG. 6B) and then presented to the MCU 607 for processing. Based on the received USB control signal, the MCU 607 may generate mode setting data (step 1105), which may be sent via the ⌐I2C Data⌐ connection identified in FIGS. 6A and 6B for storage by one or more of the control registers 620. This stored mode setting data may be retrieved and used as the mode setting signal 701 (step 1106). The mode setting signal 701 may also include, or be supplemented by, other data such as ⌐Input-Gain( ), ⌐ ⌐setBlock (Limiter), ⌐and ⌐setBlock (Comp) ⌐as indicated in FIG. 7, to set the DSP mode (step 1107). Based on the mode setting signal 701 and/or such other signals, the DSP 603 may configure itself, including configuring some or all of modules 702-708, to processing sound detected by the microphone 100 (step 1108). Each mode may have one or more settings that are adjustable within the mode, either manually by the user or automatically and dynamically by the DSP 603 itself without the need for manual intervention (step 1109). If the user selects another DSP mode, then the process of FIG. 11 may return to step 1103 for selection of the next DSP mode, and the remainder of the process may repeat as needed.

Figure 8:
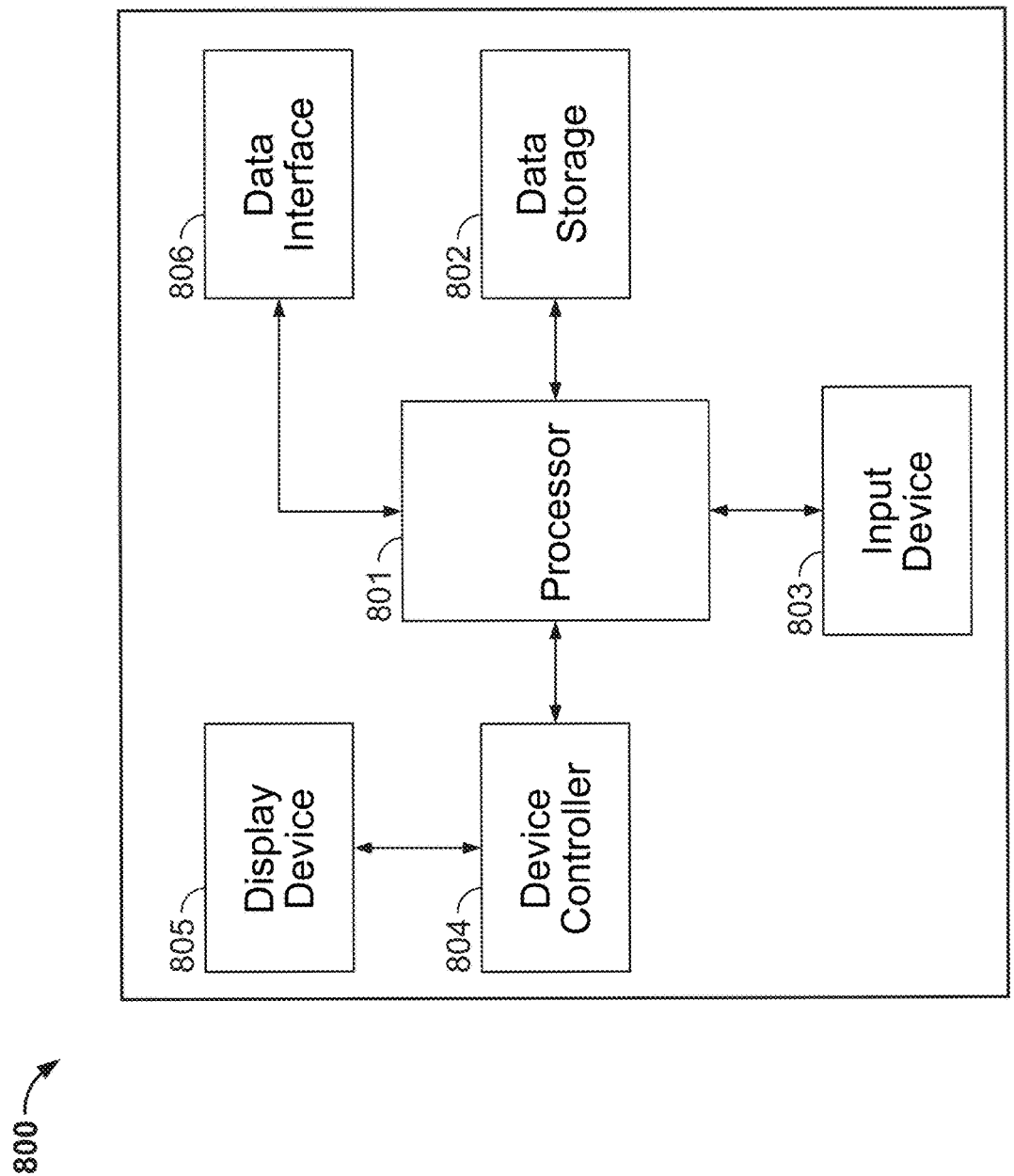
FIG. 8 shows a block diagram of an example computing device, in accordance with aspects described herein.

FIG. 8 shows a block diagram of an example computing device 800. The computing device 800 may be used to implement at least a portion of the device 202 and/or at least a portion of the microphone 100. For example, some or all of the controller 604, some or all of the MCU 607, some or all of the DSP 603, and/or some or all of any supporting circuitry thereof, may alternatively be implemented by the computing device 800. The computing device 800 may be any type of computing device, and may be physically implemented as a single unit or a system of multiple interacting units. For example, the computing device 800 may comprise one or more smart phones, one or more tablet computers, one or more laptop computer, one or more desktop computers, and/or one or more items of audio equipment that have computing functionality, etc. The box drawn around computing device 800 in FIG. 8 is not intended to limit the computing device 800 to a single physical unit (e.g., having a single physical housing).

In the shown example, the computing device 800 may comprise a processor 801, which may itself be physically implemented by one or more processors, such as one or more microprocessors, CPUs, MCUs, etc. The computing device 800 may further comprise data storage 802, which may be implemented as one or more computer-readable media, which may be non-transitory, such as one or more memories (e.g., RAM, ROM, FLASH, etc.), hard drives, removable drives, memory sticks, etc. The computing device 800 may further comprise an input device 803, such as a touch interface of a display, a mouse, a keyboard, a voice control device, etc. The computing device 800 may further comprise a device controller 804 for controlling an output device such as a display device 805. The display device 805 may be touch-sensitive, in which case the display device 805 may also serve as the input device 803. The computing device 800 may further comprise a data interface 806 for communicating with one or more devices external to the computing device 800. For example, the data interface 806 may comprise a USB interface, an XLR interface, and/or a wireless interface (e.g., WiFi, BLUETOOTH, NFC, infrared). As another example, the data interface 806 may implement the XLR interface or the USB interface of the device 202, the XLR interface of XLR compatible device 203, the USB interface 621 for the USB connector 108b, and/or the XLR interface for the XLR connector 108a.

The data storage 802 may store computer-executable instructions that, when executed by the processor 801, may cause the computing device 800 to perform various steps. For example, when executed by any processors of the microphone 100, the instructions may cause the microphone 100 to perform any or all of steps 1105-1109, and/or to perform any other functionality of the microphone 100. As another example, when executed by any processors of the device 202, the instructions may cause the device 202 to perform any or all of steps 1102-1104, and/or to perform any other functionality of the device 202.

The data storage 802 may also store other data. For example, where the data storage 802 is part of the device 202, the data storage 802 may store its operating system and/or the software application that performs steps 1102-1104, user preferences such as preferred DSP modes, a list of microphones (such as the microphone 100) previously setup with the software application, communication protocol settings, and/or data supporting any other functionality of the device 202. Where the data storage 802 is part of the microphone 100, the data storage 802 may, for example, embody the control registers 620 and/or may store any of the data used for selecting and configuring DSP modes, any other settings of the DSP 603, communication protocol settings, and/or data supporting any other functionality of the microphone 100.

A ribbon microphone assembly may comprise a capsule which may comprise at least two magnets; a ribbon diaphragm positioned between the at least two magnets; and a transformer connected to the directional ribbon diaphragm; and a housing connected to the capsule comprising: a circuit board connected to the transformer comprising: an amplifier configured to receive a sound signal from the transformer and generate an amplified sound signal; an analog to digital converter configured to receive the amplified sound signal and generate a digital sound signal; and a digital signal processor configured to receive the digital sound signal, compensate for an on-axis frequency response caused by a directional polar response of the ribbon microphone assembly, and generate a processed sound signal. The ribbon microphone assembly may further comprise a USB port configured to output the processed sound signal. The ribbon microphone assembly may comprise a transformer that employs a 33:1 turn ratio. The ribbon microphone assembly may comprise an XLR port configured to output the processed sound signal. The ribbon microphone assembly may comprise both a USB port configured to output the processed sound signal and an XLR port configured to output the processed sound signal. The digital signal processor of the ribbon microphone assembly may comprise a computing device. The digital signal processor may be configured to attenuate, based on the directional polar response of the ribbon microphone assembly, at least one frequency represented by the digital sound signal. The digital signal processor may be configured to boost, based on the directional polar response of the ribbon microphone assembly, at least one frequency represented by the digital sound signal. The ribbon microphone assembly may be configured to receive, via USB and from a user device, an indication of a frequency compensation filter. The digital signal processor may be configured to generate the processed sound signal at least by applying the frequency compensation filter. The ribbon microphone assembly may further comprise a control accessible from an exterior of the housing, and may be configured to receive a user selection of a frequency compensation filter, wherein the digital signal processor may be configured to generate the processed sound signal at least by applying the frequency compensation filter. The directional polar response of the ribbon microphone assembly may be at least one of: a bidirectional polar response, a cardioid polar response, a hypercardioid polar response, or a variable polar response.

A system may comprise a microphone assembly tuned for a directional polar response and configured to receive a sound signal, an amplifier configured to receive the sound signal and generate an amplified sound signal, an analog to digital converter configured to receive the amplified sound signal and generate a digital sound signal, and a digital signal processor configured to receive the digital sound signal, compensate for an on-axis frequency response caused by a directional polar response of the microphone assembly, and generate a processed sound signal. The microphone assembly may comprise a ribbon transducer. The microphone assembly of the system may further comprise a control accessible from an exterior of the housing. The microphone assembly may be configured to receive a user selection of a frequency compensation filter, wherein the digital signal processor may be configured to generate the processed sound signal at least by applying the frequency compensation filter. The microphone assembly of the system may be configured to receive, via USB and from a user device, an indication of a frequency compensation filter, and the digital signal processor may be configured to generate the processed sound signal at least by applying the frequency compensation filter. The system may also include a USB port configured to output the processed sound signal. The digital signal processor may be configured to attenuate or boost, based on the directional polar response of the ribbon microphone assembly, at least one frequency represented by the digital sound signal.

A directional ribbon microphone assembly may comprise a ribbon diaphragm and circuitry that may be configured to generate, based on a first signal from the ribbon diaphragm, a second signal by at least compensating for an on-axis frequency response associated with a directional polar response of the ribbon microphone assembly. The first signal may comprise an analog signal and the second signal may comprise a digital signal. The circuitry may comprise an amplifier configured to amplify the first signal to generate an amplified first signal, an analog-to-digital converter configured to digitize the amplified first signal to generate a digitized first signal, and a digital signal processor configured to process the digitized first signal to generate the second signal. The circuitry may be configured to receive an indication of a user-selected frequency compensation filter and to generate the second signal by at least applying the user-selected frequency compensation filter.

In the foregoing specification, the present disclosure has been described with reference to specific exemplary examples thereof. Although the invention has been described in terms of a preferred example, those skilled in the art will recognize that various modifications, examples or variations of the invention can be practiced within the spirit and scope of the invention as set forth in the appended claims. The specification and drawings are, therefore, to be regarded in an illustrated rather than restrictive sense. Accordingly, it is not intended that the invention be limited except as may be necessary in view of the appended claims.

The invention claimed is:

1. A ribbon microphone assembly comprising:
  a capsule comprising:
    at least two magnets;
    a ribbon diaphragm positioned between the at least two magnets; and
    a transformer connected to the ribbon diaphragm; and
  a housing connected to the capsule comprising:

a circuit board connected to the transformer comprising:
an amplifier configured to receive a sound signal from the transformer and generate an amplified sound signal;
an analog to digital converter configured to receive the amplified sound signal and generate a digital sound signal; and
a digital signal processor configured to receive the digital sound signal, compensate for an on-axis frequency response caused by a directional polar response of the ribbon microphone assembly, and generate a processed sound signal.

2. The ribbon microphone assembly according to claim 1, further comprising a USB port configured to output the processed sound signal.

3. The ribbon microphone assembly according to claim 2, further comprising an external line return (XLR) output port configured to output the processed sound signal.

4. The ribbon microphone assembly according to claim 1, further comprising an external line return (XLR) port configured to output the processed sound signal.

5. The ribbon microphone assembly according to claim 1, wherein the digital signal processor comprises a computing device.

6. The ribbon microphone assembly according to claim 1, wherein the digital signal processor is configured to attenuate, based on the directional polar response of the ribbon microphone assembly, at least one frequency represented by the digital sound signal.

7. The ribbon microphone assembly according to claim 1, wherein the digital signal processor is configured to boost, based on the directional polar response of the ribbon microphone assembly, at least one frequency represented by the digital sound signal.

8. The ribbon microphone assembly according to claim 1, wherein the ribbon microphone assembly is configured to receive, via USB and from a user device, an indication of a frequency compensation filter, and wherein the digital signal processor is configured to generate the processed sound signal at least by applying the frequency compensation filter.

9. The ribbon microphone assembly according to claim 1, further comprising a control accessible from an exterior of the housing, and configured to receive a user selection of a frequency compensation filter, wherein the digital signal processor is configured to generate the processed sound signal at least by applying the frequency compensation filter.

10. The ribbon microphone assembly according to claim 1, wherein the directional polar response is at least one of: a bidirectional polar response, a cardioid polar response, a hypercardioid polar response, or a variable polar response.

11. A system comprising:
a ribbon microphone capsule tuned for a directional polar response and configured to receive a sound signal;
an amplifier configured to receive the sound signal from the ribbon microphone capsule and generate an amplified sound signal;
an analog to digital converter configured to receive the amplified sound signal and generate a digital sound signal; and
a digital signal processor configured to receive the digital sound signal, compensate for an on-axis frequency response caused by the directional polar response of the ribbon microphone capsule, and generate a processed sound signal.

12. The system according to claim 11, wherein the ribbon microphone capsule further comprises a control accessible from an exterior of a housing and configured to receive a user selection of a frequency compensation filter, wherein the digital signal processor is configured to generate the processed sound signal at least by applying the frequency compensation filter.

13. The system according to claim 11, wherein the ribbon microphone capsule is configured to receive, via USB and from a user device, an indication of a frequency compensation filter, and wherein the digital signal processor is configured to generate the processed sound signal at least by applying the frequency compensation filter.

14. The system according to claim 11, further comprising a USB port configured to output the processed sound signal.

15. The system according to claim 11, wherein the digital signal processor is configured to attenuate or boost, based on the directional polar response of the ribbon microphone capsule, at least one frequency represented by the digital sound signal.

16. A ribbon microphone assembly comprising:
a ribbon diaphragm; and
circuitry configured to generate, based on a first signal from the ribbon diaphragm, a second signal by at least compensating for an on-axis frequency response associated with a directional polar response of the ribbon microphone assembly.

17. The ribbon microphone assembly of claim 16, wherein the first signal comprises an analog signal and the second signal comprises a digital signal.

18. The ribbon microphone assembly of claim 16, wherein the circuitry comprises:
an amplifier configured to amplify the first signal to generate an amplified first signal;
an analog-to-digital converter configured to digitize the amplified first signal to generate a digitized first signal; and
a digital signal processor configured to process the digitized first signal to generate the second signal.

19. The ribbon microphone assembly of claim 16, wherein the circuitry is configured to receive an indication of a user-selected frequency compensation filter and to generate the second signal by at least applying the user-selected frequency compensation filter.

20. The ribbon microphone assembly of claim 16, wherein the user-selected frequency compensation filter comprises at least one of the group consisting of an attenuation of at least one frequency represented by the first signal or a boost of at least one frequency represented by the first signal.

* * * * *